(12) United States Patent
Takeyama et al.

(10) Patent No.: US 11,413,765 B2
(45) Date of Patent: Aug. 16, 2022

(54) ROBOTIC DEVICE, PRODUCTION DEVICE FOR ELECTRONIC APPARATUS, AND PRODUCTION METHOD

(71) Applicant: SONY CORPORATION, Tokyo (JP)

(72) Inventors: Shinichi Takeyama, Chiba (JP); Hirokuni Beppu, Chiba (JP); Hideaki Masamura, Chiba (JP)

(73) Assignee: SONY CORPORATION, Tokyo (JP)

( * ) Notice: Subject to any disclaimer, the term of this patent is extended or adjusted under 35 U.S.C. 154(b) by 258 days.

(21) Appl. No.: 16/497,073

(22) PCT Filed: Mar. 14, 2018

(86) PCT No.: PCT/JP2018/009872
§ 371 (c)(1),
(2) Date: Sep. 24, 2019

(87) PCT Pub. No.: WO2018/186134
PCT Pub. Date: Oct. 11, 2018

(65) Prior Publication Data
US 2020/0376679 A1 Dec. 3, 2020

(30) Foreign Application Priority Data
Apr. 3, 2017 (JP) .............................. JP2017-073584

(51) Int. Cl.
*H05K 13/00* (2006.01)
*H01R 43/26* (2006.01)
(Continued)

(52) U.S. Cl.
CPC .............. *B25J 11/005* (2013.01); *B23P 19/04* (2013.01); *B25J 9/0084* (2013.01); *H01R 43/26* (2013.01); *H05K 13/0061* (2013.01)

(58) Field of Classification Search
CPC ... H01R 43/26; H05K 13/0061; B25J 11/005; B25J 9/0084; B25J 13/082;
(Continued)

(56) References Cited

U.S. PATENT DOCUMENTS 6,971,921 B1 * 12/2005 Lai ...................... H01R 13/447
439/144
2009/0025199 A1 1/2009 Hariki et al.
(Continued)

FOREIGN PATENT DOCUMENTS

| CN | 101352807 A | 1/2009 |
|---|---|---|
| CN | 104247580 A | 12/2014 |

(Continued)

OTHER PUBLICATIONS

International Search Report and Written Opinion of PCT Application No. PCT/JP2018/009872, dated Jun. 5, 2018, 19 pages of ISRWO.

*Primary Examiner* — Peter Dungba Vo
*Assistant Examiner* — Jose K Abraham
(74) *Attorney, Agent, or Firm* — Chip Law Group

(57) ABSTRACT

A robotic device includes a first robotic device including a first articulated arm, a first clamping mechanism, and a blow-out portion. The first clamping mechanism includes a first clamping claw and a second clamping claw. The first clamping claw is attached to the first articulated arm, and has a first support surface. The second clamping claw has a second support surface to face the first support surface in a first axial direction orthogonal to the first support surface. The second clamping claw is movable in the first axial direction relative to the first clamping claw. The blow-out portion is provided to any one of the first clamping claw or
(Continued)

the second clamping claw. The blow-out portion is capable of blowing out fluid in a second axial direction orthogonal to the first axial direction.

13 Claims, 13 Drawing Sheets

(51) Int. Cl.
*B25J 11/00* (2006.01)
*B23P 19/04* (2006.01)
*B25J 9/00* (2006.01)

(58) Field of Classification Search
CPC .. B25J 15/0616; B25J 15/0066; B25J 19/023; B25J 15/0253; B23P 19/04
See application file for complete search history.

(56) References Cited

U.S. PATENT DOCUMENTS

| | | | |
|---|---|---|---|
| 2012/0197438 A1 | 8/2012 | Ogami | |
| 2013/0085604 A1* | 4/2013 | Irie | B25J 9/1697 901/46 |
| 2013/0266205 A1* | 10/2013 | Valpola | B25J 9/1697 382/153 |
| 2015/0032243 A1* | 1/2015 | Shiino | B25J 9/1602 700/112 |
| 2015/0039126 A1* | 2/2015 | Shiino | B25J 9/1679 700/245 |
| 2016/0318191 A1* | 11/2016 | Murakami | B25J 21/00 |
| 2016/0325439 A1 | 11/2016 | Murakami et al. | |

FOREIGN PATENT DOCUMENTS

| | | | |
|---|---|---|---|
| CN | 106061690 A | 10/2016 | |
| EP | 0650022 B1 * | 11/1998 | ............ F26B 21/004 |
| EP | 2018940 A2 | 1/2009 | |
| EP | 2840873 A1 | 2/2015 | |
| EP | 3081348 A1 | 10/2016 | |
| JP | 04-223886 A | 8/1992 | |
| JP | 10-240151 A | 9/1998 | |
| JP | 11-277474 A | 10/1999 | |
| JP | 2002-231348 A | 8/2002 | |
| JP | 2009-023072 A | 2/2009 | |
| JP | 2011-115877 A | 6/2011 | |
| JP | 2013022672 A * | 2/2013 | |
| JP | 2016-209967 A | 12/2016 | |
| KR | 10-2016-0119065 A | 10/2016 | |
| WO | 2011/068227 A1 | 6/2011 | |
| WO | 2013/157121 A1 | 10/2013 | |
| WO | 2015/087854 A1 | 6/2015 | |

* cited by examiner

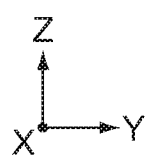

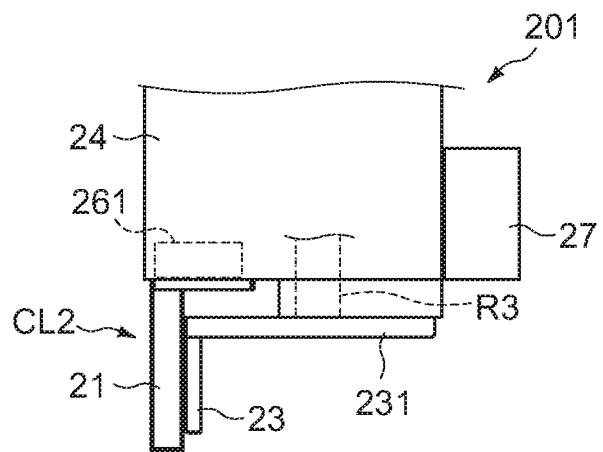
FIG. 8A
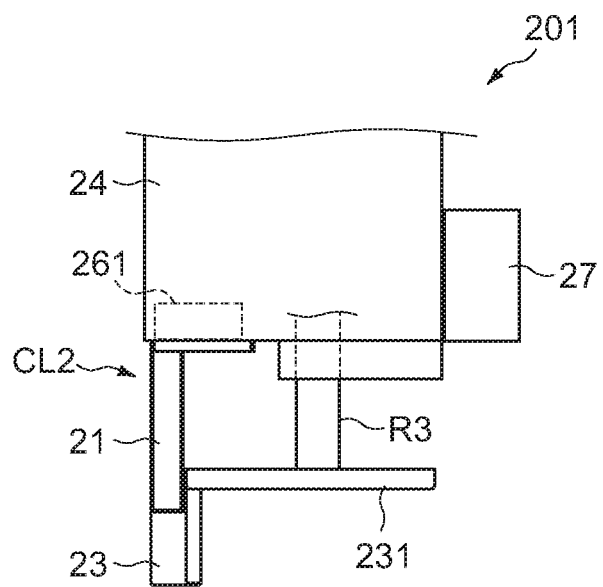
FIG. 8B
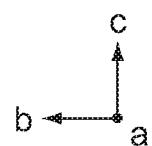

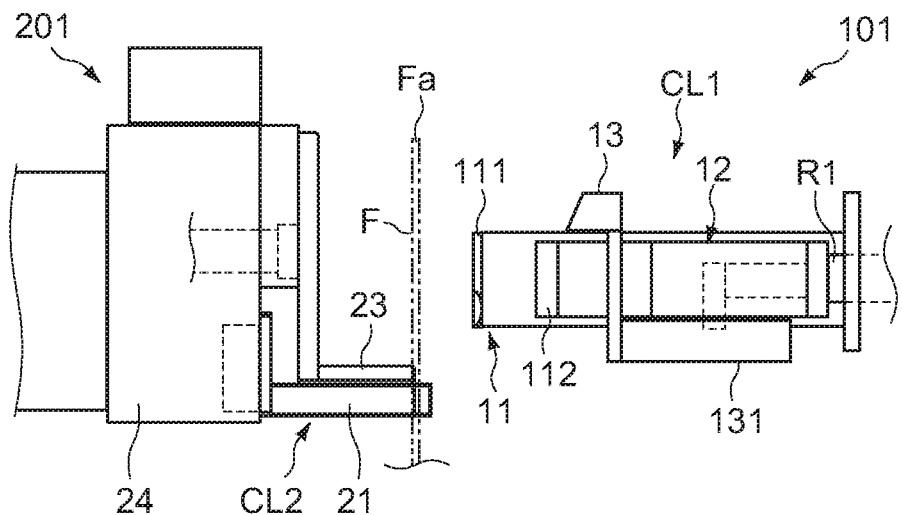
FIG. 12A
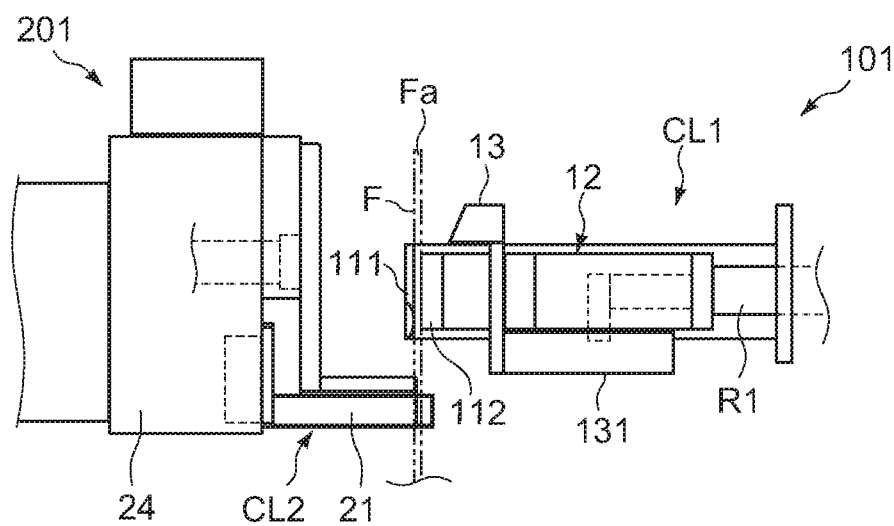
FIG. 12B
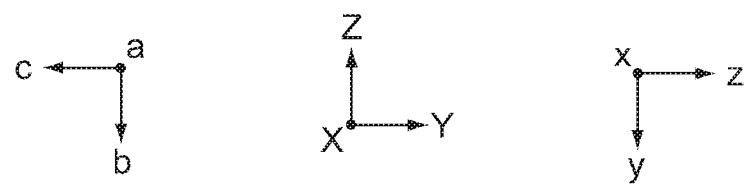

ROBOTIC DEVICE, PRODUCTION DEVICE FOR ELECTRONIC APPARATUS, AND PRODUCTION METHOD

CROSS REFERENCE TO RELATED APPLICATIONS

This application is a U.S. National Phase of International Patent Application No. PCT/JP2018/009872 filed on Mar. 14, 2018, which claims priority benefit of Japanese Patent Application No. JP 2017-073584 filed in the Japan Patent Office on Apr. 3, 2017. Each of the above-referenced applications is hereby incorporated herein by reference in its entirety.

TECHNICAL FIELD

The present technology relates to a robotic device to be used, for example, in assembly of electronic components, and relates to a production device and a production method for electronic apparatuses.

BACKGROUND ART

For example, in the manufacture of electronic apparatuses, industrial robots have been widely used for assembly of electronic components. Specifically, technologies for automatically performing a step of connecting flexible wiring members such as an FFC (Flexible Flat Cable) and an FPC (Flexible Printed Circuit) and connector components to each other have been known (refer, for example, to Patent Literature 1). Further, in recent years, in the field of the connector components, ones including an openable-and-closable locking member that maintains a state of the connection to the flexible wiring members have been known (refer, for example, to Patent Literature 2).

CITATION LIST

Patent Literature

Patent Literature 1: Japanese Patent Application Laid-open No. 10-240151
Patent Literature 2: Japanese Patent Application Laid-open No. 2002-231348

DISCLOSURE OF INVENTION

Technical Problem

When the assembly of the flexible wiring members with respect to the connector components including the locking member is automated, unless the locking member assumes an open posture suited to the assembly, the flexible wiring members cannot be properly connected to the connector components.

In view of such circumstances, the present technology has been made to achieve an object to provide a robotic device capable of, for example, properly assembling components to each other, and to provide a production device and a production method for electronic apparatuses.

Solution to Problem

A robotic device according to an embodiment of the present technology includes
a first robot.
The first robot includes
  a first articulated arm,
  a first clamping mechanism, and
  a blow-out portion.
The first clamping mechanism includes
  a first clamping claw and
  a second clamping claw.
The first clamping claw
  is attached to the first articulated arm, and
  has a first support surface.
The second clamping claw
  has a second support surface to face the first support surface in a first axial direction orthogonal to the first support surface, and
  is configured to be movable in the first axial direction relative to the first clamping claw. The first clamping mechanism is configured to be capable of clamping an object in the first axial direction with the first support surface and the second support surface.
The blow-out portion
  is provided to any one of the first clamping claw and the second clamping claw, and
  is configured to be capable of blowing out fluid in a second axial direction orthogonal to the first axial direction.

In the robotic device, since the first clamping mechanism includes the blow-out portion, for example, a connector including a locking member can be maintained in an open state by blowing out air jets to this connector while clamping the object. With this, the object can be properly assembled to the connector.

The second clamping claw may further include
  a lateral surface portion orthogonal to the second axial direction, and
the blow-out portion may be provided to the lateral surface portion.
By building the blow-out portion in the second clamping claw, the first robotic device can be downsized and simplified in configuration.

The first clamping claw may further include
  a base portion and
  a coupling portion.
The base portion is fixed to the first articulated arm.
The coupling portion
  is connected between the base portion and the first support surface, and
  extends in the first axial direction.
With this, the first clamping mechanism and the articulated arm face each other in a direction of clamping the object. Thus, for example, clamping of a belt-like object in its width direction is enabled to facilitate transportation of this object to a height of a connection target.

The robotic device may further include
a force sensor.
The force sensor
  is arranged between the first articulated arm and the base portion, and
  detects force to be applied to the first clamping mechanism.
With this, for example, a clamping force by the first clamping mechanism with respect to the object can be properly controlled.

The first clamping mechanism may further include
an up-and-down member
  that is attached to the second clamping claw, and
  that is movable in the first axial direction relative to the second clamping claw.

With this, for example, the connector including the locking member can be pushed down to its locking position by the up-and-down member.

The fluid to be blown out through the blow-out portion is not particularly limited, and may be air jets, or may be liquid.

The robotic device may further include
a second robotic device.

The second robotic device includes
a second clamping mechanism capable of clamping the object, and
a second articulated arm that supports the second clamping mechanism, the second robot transferring the object from the second clamping mechanism thereof to the first clamping mechanism.

The second robot may further include
a suction portion that sucks the object portion.

In this case, the second clamping mechanism includes
a pair of clamping claws
that face each other in one axial direction orthogonal to a direction in which the suction portion sucks the object, and
that are capable of clamping the object in the one axial direction.

With this, the object can be properly picked up and transferred to the first robot.

The first robot may further include
an imaging unit capable of capturing the object to be clamped by the first clamping mechanism.

With this, a clamping position of the object can be properly controlled.

A production device for an electronic apparatus according to another embodiment of the present technology is a production device for an electronic apparatus including
a connector including
an openable-and-closable locking member, and
a flexible wiring member including
a connecting terminal to be connected to the connector, the production device including
an articulated arm,
a clamping mechanism, and
a blow-out portion.

The clamping mechanism includes
a first clamping claw and
a second clamping claw.

The first clamping claw
is attached to the articulated arm, and
has a first support surface.

The second clamping claw
has a second support surface to face the first support surface in a first axial direction orthogonal to the first support surface, and
is configured to be movable in the first axial direction relative to the first clamping claw. The clamping mechanism is configured to be capable of clamping the flexible wiring member in the first axial direction with the connecting terminal being protruded in a second axial direction orthogonal to the first axial direction from the first support surface and the second support surface.

The blow-out portion
is provided to any one of the first clamping claw and the second clamping claw, and
is configured to be capable of blowing out air jets with respect to the locking member that faces the blow-out portion in the second axial direction.

A production method for an electronic apparatus according to still another embodiment of the present technology is a production method for an electronic apparatus including
a connector including
an openable-and-closable locking member, and
a flexible wiring member including
a connecting terminal to be connected to the connector, the production method including
causing a clamping mechanism to clamp the flexible wiring member in a thickness direction of the flexible wiring member.

The clamping mechanism is transported to a position at which the connecting terminal faces the connector.

The locking member is opened by blowing out air jets from the clamping mechanism to the connector.

The connecting terminal is connected to the connector by causing the clamping mechanism to bring the flexible wiring member close to the connector.

Advantageous Effects of Invention

As described above, according to the present technology, for example, components can be properly assembled to each other.

Note that, the advantages disclosed herein are not necessarily limited to those described hereinabove, and not only the advantages described hereinabove but also those described hereinbelow can be obtained.

BRIEF DESCRIPTION OF DRAWINGS

FIGS. 8A and 8B A schematic left-hand side view illustrating a clamping mechanism of the second robot on an enlarged scale, and an explanatory view illustrating an operation example of the same.

FIGS. 12A and 12B Explanatory main-part schematic side views illustrating a transfer step of transferring the connecting member from the second robot to the first robot.

MODE(S) FOR CARRYING OUT THE INVENTION

Now, an embodiment according to the present technology is described with reference to the drawings.

Figure 1:
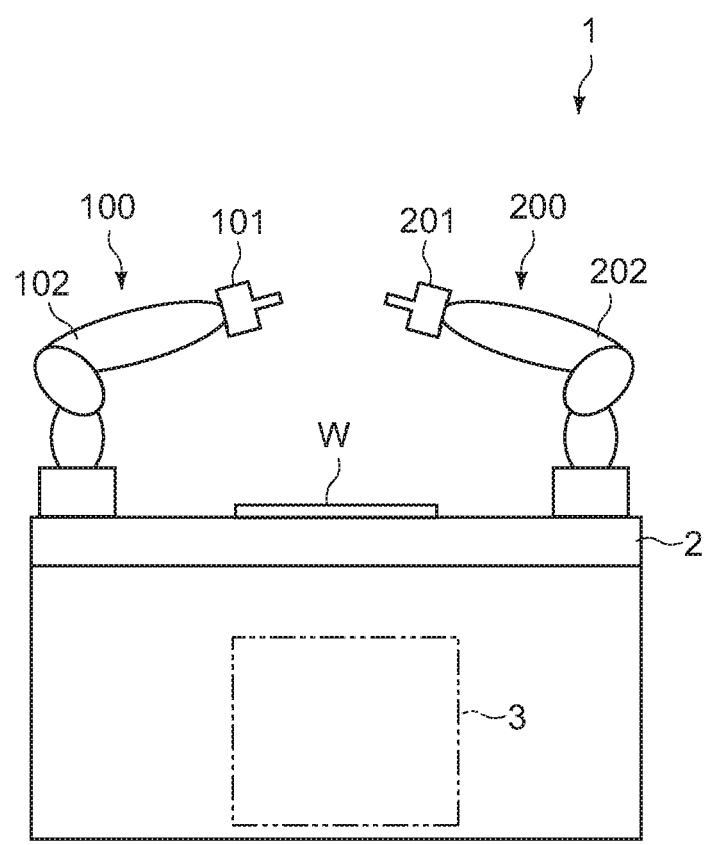
FIG. 1 A schematic side view illustrating a production device (robotic device) for electronic apparatuses according to an embodiment of the present technology.

FIG. 1 is a schematic side view illustrating a production device (robotic device) for electronic apparatuses according to an embodiment of the present technology. In this embodiment, an example of application of the present technology to an automatic connecting step for a wiring member, which is one of production steps for the electronic apparatuses, is described.

Schematic Configuration of Robotic Device

A robotic device 1 of this embodiment includes an assembly robot 100 (first robot), a transport robot 200 (second robot), a work table 2 that supports a semi-finished product of an electronic component (hereinafter, referred to as "workpiece W"), and a controller 3 that drives and controls the assembly robot 100 and the transport robot 200.

The assembly robot 100 includes a hand portion 101, and an articulated arm 102 capable of moving the hand portion 101 with six degrees of freedom (first articulated arm).

The transport robot 200 similarly includes a hand portion 201, and an articulated arm 202 capable of moving the hand portion 201 with the six degrees of freedom (second articulated arm).

The articulated arms 102 and 202, which are arranged on the work table 2 or near the work table 2, are connected respectively to their drive sources (not shown).

Details of the hand portion 101 and 102 are described below.

The controller 3, which is typically constituted by a computer including a CPU (Central Processing Unit) and a memory, is configured to drive the assembly robot 100 and the transport robot 200 in accordance with a program stored in the memory.

Examples of controlling both the robots 100 and 200 by the controller 3 are also described below.

Figure 2A:
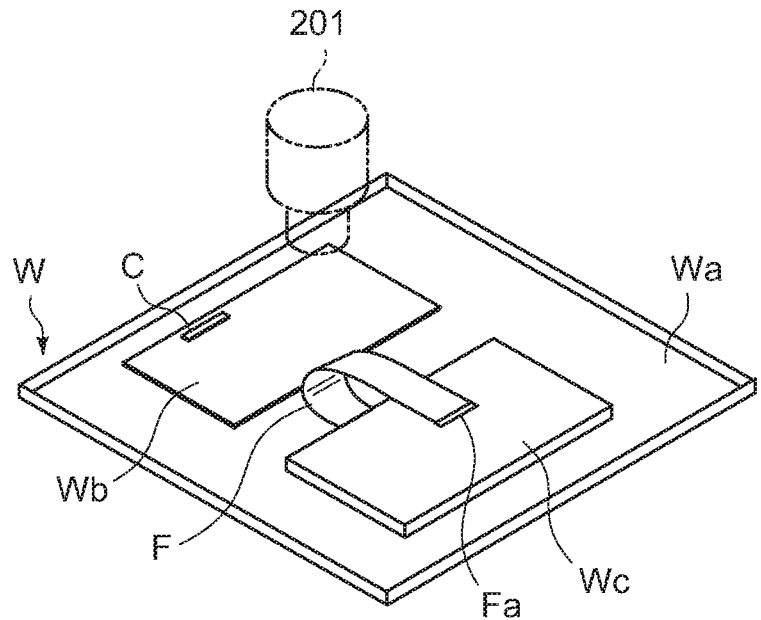
FIGS. 2A, 2B, and 2C Explanatory schematic views illustrating a state of a connecting member being an assembly target, and an assembly procedure therefor.
Figure 2B:
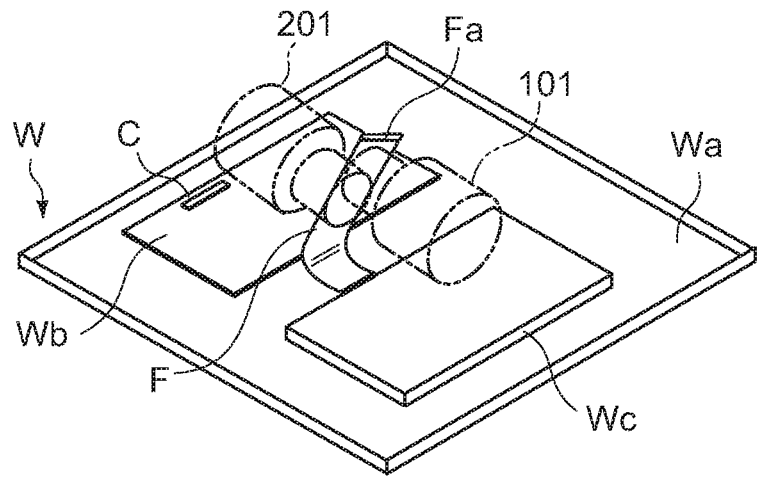
Figure 2C:
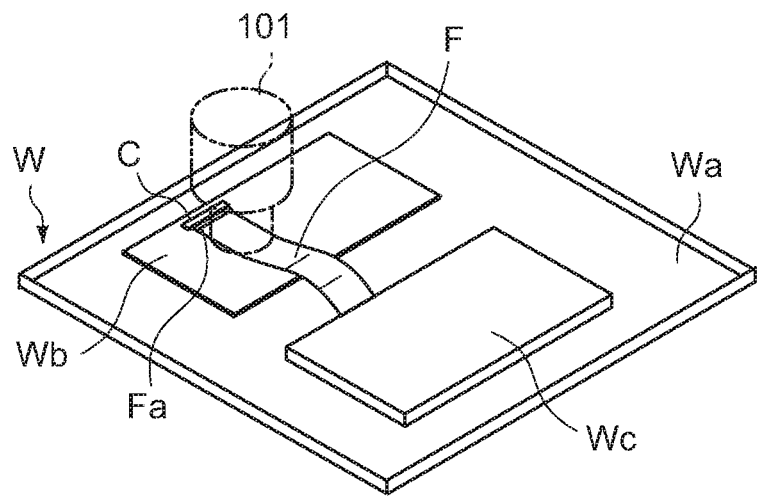

FIG. 2A is a schematic perspective view illustrating an example of the workpiece W, FIGS. 2B and 2C are schematic views illustrating a procedure by the robotic device 1 with respect to the workpiece W.

Figure 3A:
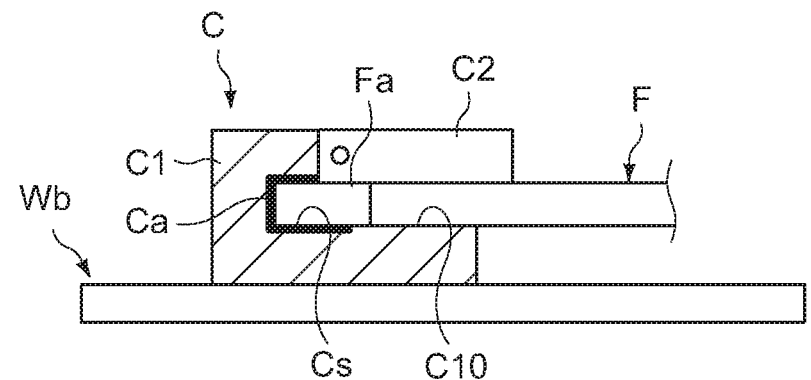
FIGS. 3A, 3B, and 3C Explanatory main-part schematic cross-sectional side views illustrating a configuration of a connector component to be connected to the connecting member.
Figure 3B:
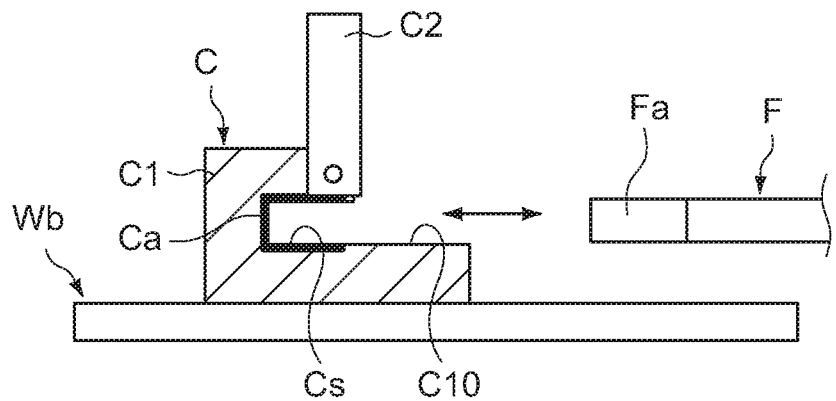
Figure 3C:
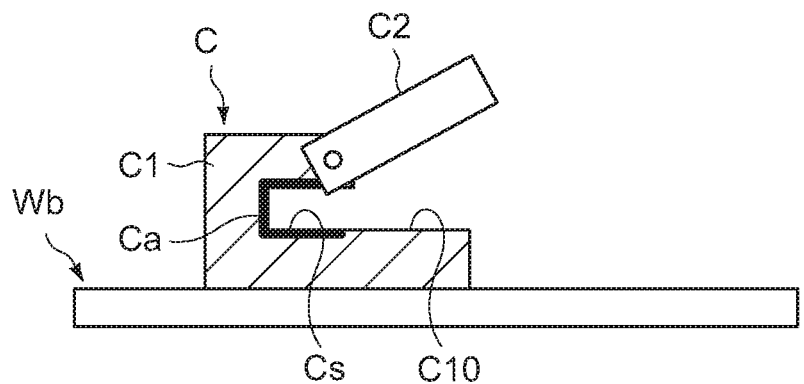

Note that, in the drawing, of an X-axis, a Y-axis, and a Z-axis representing tri-axial directions orthogonal to each other, the Z-axis corresponds to a height direction (the same applies to FIGS. 3A, 3B, and 3C).

The workpiece W includes a workpiece body Wa, and a circuit board Wb and an electronic unit Wc that are arranged on the workpiece body Wa.

As examples of the workpiece body Wa, there may be mentioned a part of a casing of the electronic apparatus, a plate-like support arranged in the casing, or the like. The circuit board Wb, which is a component mounting board being a printed circuit board to which various electronic components are mounted, has an upper surface to a part of which a connector component C is mounted. The electronic unit Wc, which exerts one of functions of the electronic apparatus, typically includes a built-in computer including a CPU, a memory, and the like.

The circuit board Wb and the electronic unit Wc are electrically connected to each other via a wiring member F. The wiring member F, which is a flexible belt-like connecting member such as FFC or FPC, has one end that has already been connected to the electronic unit Wc, and has another end (terminal portion Fa) that has not yet been connected to the connector component C. The wiring member F is placed at an appropriate position on the workpiece body Wa, the circuit board Wb, or the electronic unit Wc (on electronic unit Wc in the example illustrated in FIG. 2A). A terminal portion Fa includes a plurality of terminal portions (such as 40 pins) that is arrayed at a predetermined pitch in its width direction.

The workpiece W is placed on the work table 2 as in a state illustrated in FIG. 2A. The robotic device 1 is configured to be capable of automatically assembling the terminal portion Fa of the wiring member F to the connector component C. FIGS. 2B and 2C each illustrate an overview of how the terminal portion Fa is connected to the connector component C by the robotic device 1.

As illustrated in FIGS. 2B and 2C, the robotic device 1 performs, as described below, a step of causing the transport robot 200 to pick up and deliver the wiring member F to the assembly robot 100 (FIG. 2B), and a step of causing the assembly robot 100 to connect the terminal portion Fa of the wiring member F to the connector component C (FIG. 2C).

FIGS. 3A, 3B, and 3C are each an explanatory main-part schematic cross-sectional side view illustrating a configuration of the connector component C.

The connector component C includes a body portion C1 including a terminal portion Ca, and a locking member C2 configured to be pivotable with respect to the body portion C1.

The body portion C1 is formed of a substantially-cuboid plastic molded article having its longitudinal direction in the X-axis direction. The body portion C1 includes a stage portion C10 that is mounted to the circuit board Wb. In addition, in a lateral surface portion on one side of the body portion C1, which is orthogonal to the Y-axis direction, a groove portion Cs to which the terminal portion Fa of the wiring member F is fitted is provided parallel to the X-axis direction. The terminal portion Ca, which is provided on an inner surface of the groove portion Cs, is electrically connected to the terminal portion Fa fitted to the groove portion Cs (refer to FIG. 3A).

The locking member C2 is formed of a plate-like plastic molded article, one end of which is pivotally supported by an upper portion of the groove portion Cs of the body portion C1, and which has its longitudinal side in the X-axis direction. The locking member C2 is configured to be openable and closable between a locking position at which the stage portion C10 is shielded from above as illustrated in FIG. 3A, and an open position at which the stage portion C10 is opened upward as illustrated in FIG. 3B. Although detailed description of this mechanism is omitted, the connector component C is configured to be capable of holding the wiring member F with a predetermined clamping force between the locking member C2 and the stage portion C10 at the locking position.

The locking member C2 is also configured to be capable of taking a half-open position, specifically, capable of stopping at an appropriate pivotal position between the locking position and the open position as illustrated in FIG. 3C. The connector component C has a click mechanism capable of pivoting freely between the half-open position and the open position, and capable of pivoting between the half-open position and the locking position only when an operational force at a predetermined level or higher is applied.

In this context, in the connector component C having the above-described configuration, under the state in which the locking member C2 is at the half-open position (FIG. 3B) or at the locking position (FIG. 3C), it is more difficult to insert the terminal portion Fa of the wiring member F into the groove portion Cs than to insert the terminal portion Fa into the groove portion Cs under the state in which the locking member C2 is at the open position (FIG. 3A). Thus, for automation of the connection of the wiring member F to the connector component C, additional means for maintaining the locking member C2 at the open position is needed. Further, the individual workpieces W vary from each other, and hence, with regard to the open/close state of the locking member C2, the locking member C2 need to pivot properly to the open position in accordance with the individual workpieces W.

In view of the circumstances, in this embodiment, in order to pivot the locking member C2 reliably to the open position such that an operation of connecting the wiring member F can be stably performed at the time of connecting the wiring member F to the connector component C, the assembly robot 100 is configured as follows.

Now, details of the assembly robot 100 as the first robot are described.

First Robot

Figure 4:
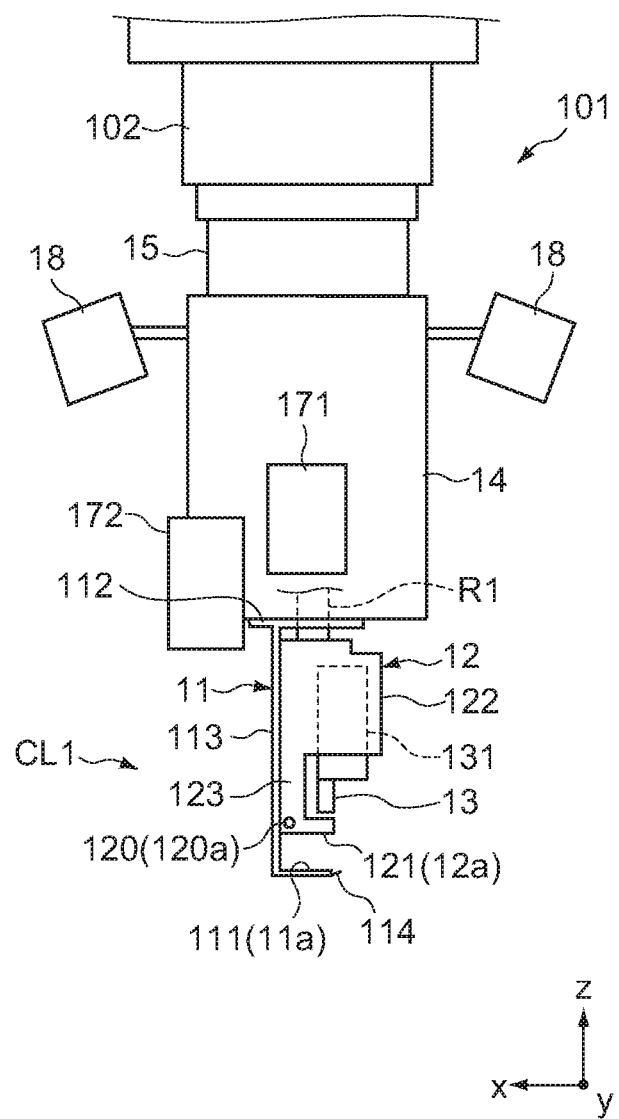
FIG. 4 A main-part schematic front view illustrating a configuration of a first robot in the robotic device.
Figure 5A:
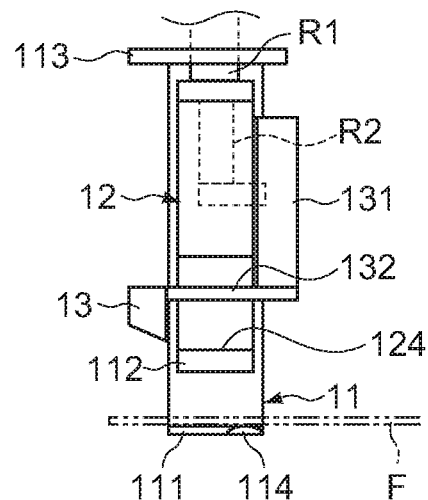
FIGS. 5A, 5B, and 5C A schematic side view illustrating a clamping mechanism of the first robot on an enlarged scale, and explanatory views illustrating an operation example of the same.
Figure 5B:
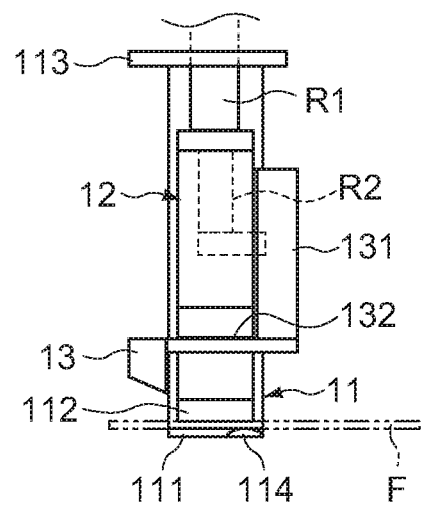
Figure 5C:
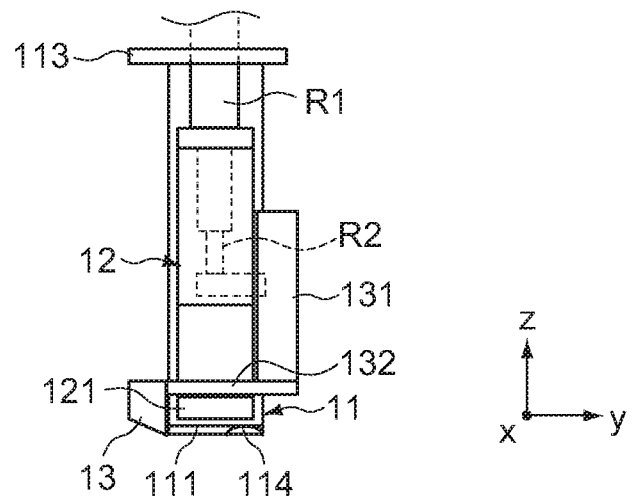

FIG. 4 is a schematic front view illustrating a configuration of the hand portion 101. FIG. 5A is a schematic right-hand side view illustrating its clamping mechanism on an enlarged scale. FIGS. 5B and 5C are explanatory views illustrating an operation example of this clamping mechanism.

Note that, in these drawings, an x-axis, a y-axis, and a z-axis represent tri-axial directions orthogonal to each other.

The hand portion 101 includes a clamping mechanism CL1 (first clamping mechanism) including support portions 111 and 121 capable of clamping the wiring member F in its thickness direction. The hand portion 101 further includes, for example, a base block 14, a first camera 171, a second camera 172, a plurality of illuminators 18, and a force sensor 15.

The base block 14 supports the clamping mechanism CL1, the first and the second cameras 171 and 172 (capturing unit), and the plurality of illuminators 18.

The first camera 171 is configured to be capable of capturing the wiring member F clamped by the clamping mechanism CL1. As described below, the second camera 172 is configured to be capable of capturing the wiring member F at the time of receiving the wiring member F from the transport robot 200. Image signals acquired by the first and the second cameras 171 and 172 are output to the controller 3.

The plurality of illuminators 18 is light sources for illuminating the clamping mechanism CL1 and its vicinity at the time of capturing by the cameras 171 and 172.

The force sensor 15, which is provided between the hand portion 101 and the articulated arm 102, is configured to be capable of detecting an external force to be applied to the hand portion 101, and a reactive force of the clamping mechanism CL1. Signals of the detection by the force sensor 15 are output to the controller 3.

(First Clamping Mechanism)

The clamping mechanism CL1 includes a first clamping claw 11 having a support surface 11a (first support surface), and a second clamping claw 12 having a support surface 12a (second support surface). The clamping mechanism CL1 is configured to be capable of clamping the wiring member F in its thickness direction with the support surfaces 11a and 12a (refer to FIG. 5A).

The first clamping claw 11, which is typically formed of a metal plate member, may be formed of a synthetic resin material. The first clamping claw 11 includes the support portion 111, a base portion 112, and a coupling portion 113 that couples the support portion 111 and the base portion 112 to each other.

The support portion 111, which corresponds to a hook portion protruding in a horizontal direction from a lower end portion of the first clamping claw 11, has, as its upper surface, the support surface 11a (first support surface) that is formed to support a main surface on one side of the belt-like wiring member F (lower surface of the wiring member F illustrated in FIG. 5A).

The base portion 112, which is formed of a plate-like portion provided at an upper end portion of the first clamping claw 11, is fixed to a distal end portion of the articulated arm 102 by being connected to a lower end portion of the base block 14.

The coupling portion 113 is formed of a plate-like portion that extends in the Z-axis direction orthogonal to both the support portion 111 and the base portion 112. The coupling portion 113 is provided adjacent in the X-axis direction to the second clamping claw 12.

The first clamping claw 11 further includes a protruding portion 114. As described below, the protruding portion 114 is formed for lifting the locking member C2 of the connector component C from the locking position to the open position or the half-open position. Where and how to form the protruding portion 114 are not particularly limited. In this embodiment, the protruding portion 114 is formed into a shape of a partial disc provided with an upward inclination at a predetermined angle from a distal end portion of the support portion 111 (refer to FIG. 4 and FIG. 5A).

The second clamping claw 12 includes the support portion 121, and a proximal portion 122 provided above the support portion 121. The second clamping claw 12 may be made of a metal material, or may be made of a synthetic resin material.

The support portion 121, which is provided at a lower end portion of the second clamping claw 12, has, as its lower surface, the support surface 12a (second support surface) that is formed to face the support surface 11a of the first clamping claw 11 in the Z-axis direction.

The proximal portion 122, which is adjacent in the x-axis direction to the coupling portion 113 of the first clamping claw 11, is configured to be movable in the z-axis direction relative to the first clamping claw 11 by a drive rod R1 of a first drive cylinder installed in the base block 14 (refer to FIG. 5B).

The clamping mechanism CL1 further includes a blow-out portion 120. As described below, the blow-out portion 120 is provided for causing the locking member C2 of the connector component C to pivot from the half-open position to the open position.

The blow-out portion 120 is configured to be capable of blowing out fluid (air jets in this example) in the y-axis direction. The blow-out portion 120 includes a blow-out port 120a provided through a lateral surface portion 123 of the proximal portion 122, which is orthogonal to the Y-axis direction, and an air source (not shown) installed in the base block 14 or the articulated arm 102 through the proximal portion 122. Where to provide the blow-out port 120a is not particularly limited. In this embodiment, the blow-out port 120a is provided at a lowermost end position of the second clamping claw 12 or its vicinity (refer to FIG. 4).

The clamping mechanism CL1 further includes an up-and-down member 13. As described below, the up-and-down member 13 is provided for causing the locking member C2 of the connector component C to pivot from the open position to the locking position.

The up-and-down member 13 is formed of an elastic material having moderate cushioning properties, such as rubber, elastomeric resins, and the like. The up-and-down member 13 is arranged on a front side of the second clamping claw 12 (proximal portion 122).

The up-and-down member 13 is supported by a movable block 131 attached to a rear surface of the second clamping claw 12 (proximal portion 122) via a support arm 132.

The movable block 131 is configured to be capable of being moved up and down integrally with the second clamping claw 12 by driving the first drive cylinder (drive rod R1) (refer to FIG. 5B). The movable block 131 is configured also to be movable in the z-axis direction relative to the second clamping claw 12 by a drive rod R2 of a second drive cylinder installed in the base block 14 (refer to FIG. 5C).

The support arm 132, which extends in the y-axis direction through a cutout portion 124 provided in the proximal portion 122, couples the up-and-down member 13 and the movable block 131 to each other (refer to FIG. 5A).

Second Robot

Figure 6:
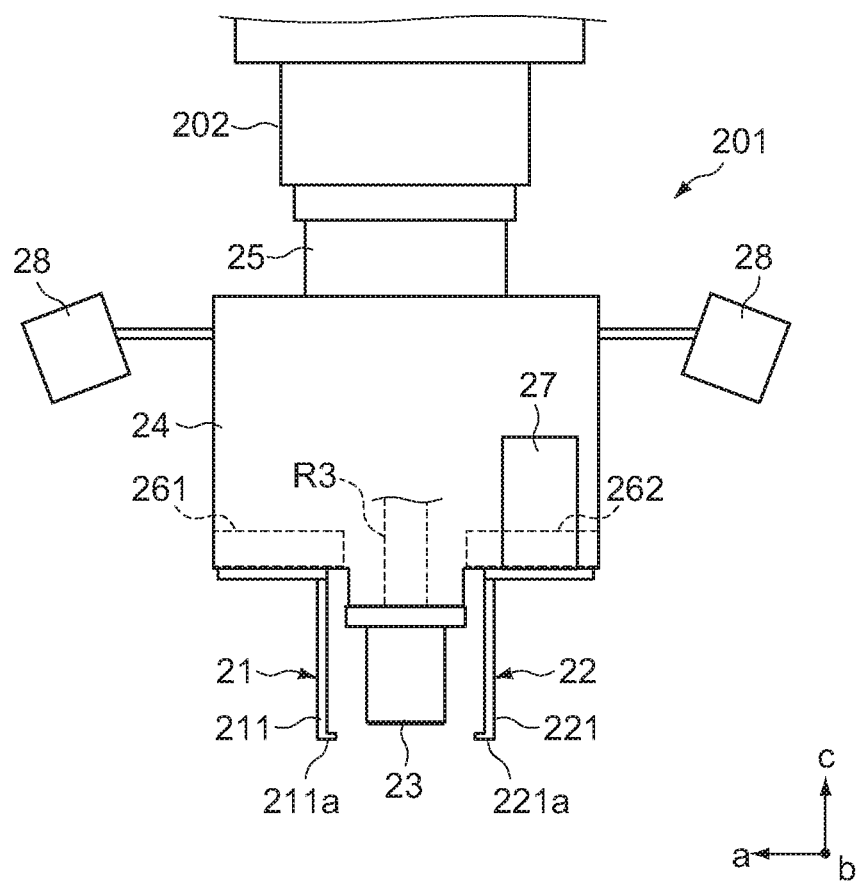
FIG. 6 A main-part schematic front view illustrating a configuration of a second robot in the robotic device.
Figure 7:
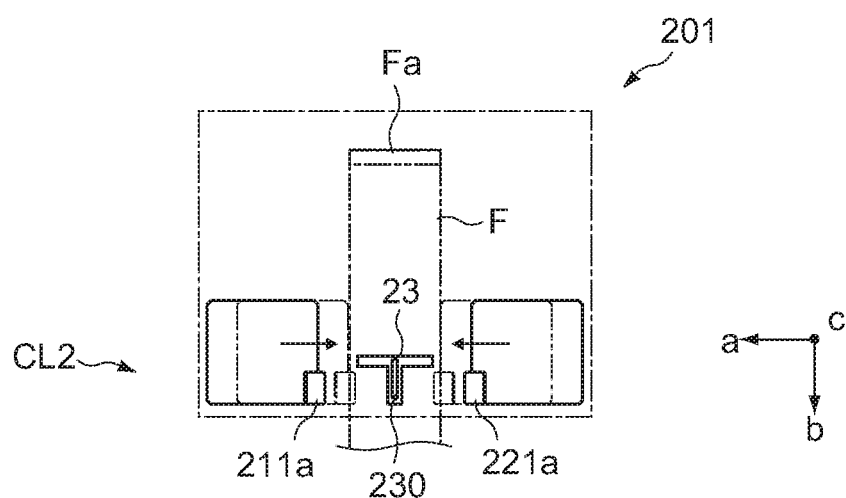
FIG. 7 A main-part bottom view illustrating the second robot.

FIG. 6 is a schematic front view illustrating a configuration of the hand portion 201. FIG. 7 is a main-part bottom view illustrating the hand portion 201. FIG. 8A is a schematic left-hand side view illustrating a clamping mechanism of the hand portion 201 on an enlarged scale. FIG. 8B is a view illustrating an operation example of this clamping mechanism.

Note that, in these drawings, an a-axis, a b-axis, and a c-axis represent tri-axial directions orthogonal to each other.

The hand portion 201 includes a clamping mechanism CL2 (second clamping mechanism) including support portions 211 and 221 capable of clamping the wiring member F in its thickness direction, and a suction member 23 (suction portion). The hand portion 201 further includes, for example, a base block 24, a camera 27, a plurality of illuminators 28, and a force sensor 25.

The base block 24 supports the clamping mechanism CL2, the camera 27, and the plurality of illuminators 28.

As described below, the camera 27 is configured to be capable of capturing the wiring member F at the time of picking up the wiring member F from the workpiece W. Image signals acquired by the camera 27 are output to the controller 3.

The plurality of illuminators 28 is light sources for illuminating the clamping mechanism CL2 and its vicinity at the time of capturing by the camera 27.

The force sensor 25, which is provided between the hand portion 201 and the articulated arm 202, is configured to be capable of detecting an external force to be applied to the hand portion 201, and a reactive force of the clamping mechanism CL2. Signals of the detection by the force sensor 25 are output to the controller 3.

(Second Clamping Mechanism)

The clamping mechanism CL2 includes a first clamping claw 21 and a second clamping claw 22. The clamping mechanism CL2 is configured to be capable of clamping the wiring member F in its thickness direction with the support portions 211 and 221 provided respectively at lower ends of the first and the second clamping claws 21 and 22 (refer to FIG. 7 and FIG. 8A).

The first and the second clamping claws 21 and 22, each of which is typically formed of a metal plate member, may each be formed of a synthetic resin material. The first and the second clamping claws 21 and 22 are configured to be movable in a direction toward or away from each other by drive portions 261 and 262 built in the base block 24 so as to face each other in the a-axis direction. The support portions 211 and 221 respectively include hook portions 211a and 221a capable of supporting edge portions of a main surface on another side of the wiring member F under a state in which a main surface on one side of the same is sucked by the suction member 23.

The suction member 23, which is arranged between the first clamping claw 21 and the second clamping claw 22, sucks the wiring member F in a direction orthogonal to the direction in which the first and the second clamping claws 21 and 22 clamps the wiring member F. As illustrated in FIG. 7, a bottom portion of the suction member 23 has a T-shaped suction surface, and a slot-like suction port 230 in the b-axis direction, specifically, in its longitudinal suction surface. The suction port 230 is connected to a negative-pressure source (not shown) installed in the base block 24 or the articulated arm 202.

The suction member 23 is configured to be movable in the c-axis direction relative to the first and the second clamping claws 21 and 22 by a drive rod R3 of a third drive cylinder installed in the base block 24 (refer to FIG. 8B). As illustrated in FIGS. 8A and 8B, the suction member 23 is connected to the drive rod R3 via a support plate 231 attached to a distal end of the drive rod R3.

Production Method for Electronic Apparatuses

Next, a typical operation of the robotic device 1 configured as described above is described.

Figure 9:
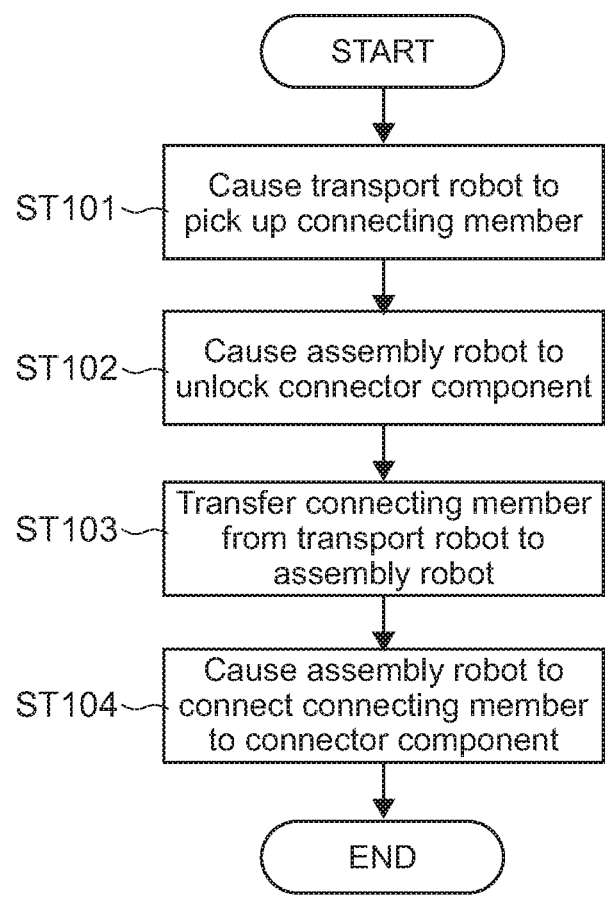
FIG. 9 A flowchart showing an operating procedure of the robotic device.

FIG. 9 is a flowchart showing an operating procedure of the robotic device 1.

The controller 3 performs the pick-up step of causing the transport robot 200 to pick up the wiring member F (Step 101), an unlocking step of causing the assembly robot 100 to unlock the connector component C (Step 102), a transfer step of transferring the wiring member F from the transport robot 200 to the assembly robot 100 (Step 103), and the connecting step of causing the assembly robot 100 to connect the wiring member F to the connector component C (Step 104).

Now, these steps are described. In the following description, the hand portions 101 and 201 of the respective robots are mainly described. Their operations are controlled by the controller 3.

(Pick-Up Step)

Figure 10A:
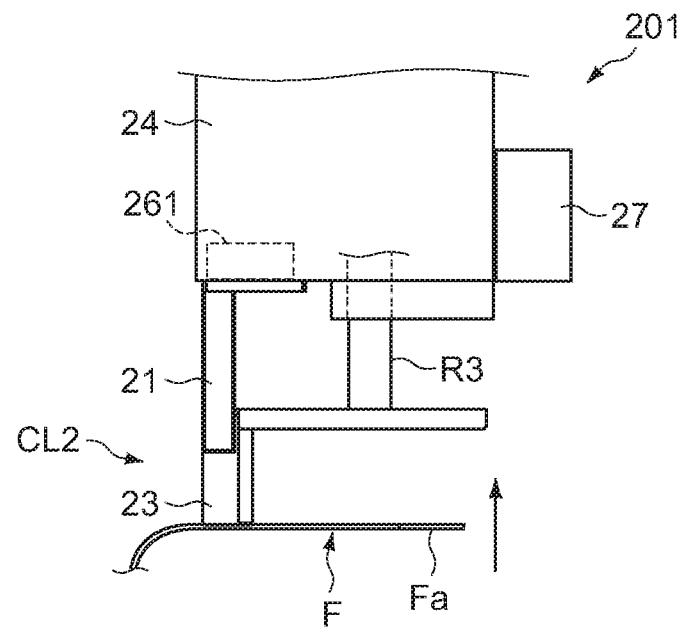
FIGS. 10A and 10B Explanatory main-part schematic side views illustrating a pick-up step for the connecting member.
Figure 10B:
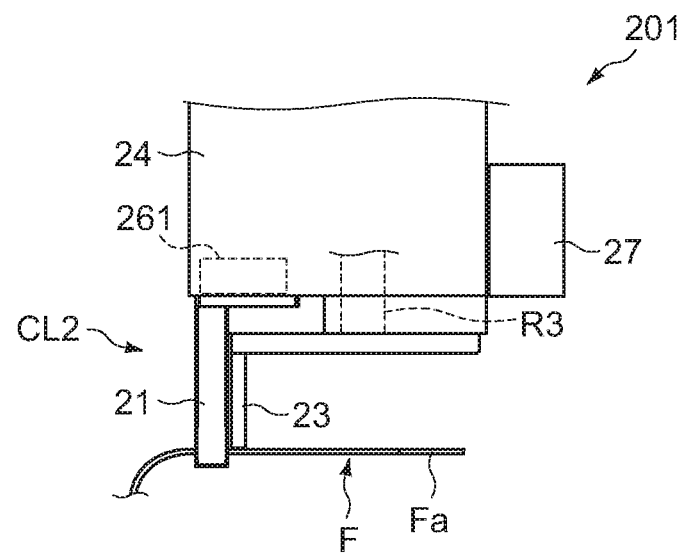

FIGS. 10A and 10B are explanatory main-part schematic side views illustrating the pick-up step for the wiring member F.

In this step, the transport robot 200 (hand portion 201) is moved to directly above the wiring member F on the workpiece W, and sucks and holds the terminal portion Fa side of the wiring member F.

In searching for the wiring member F on the workpiece W, images depicting the wiring member F on the workpiece W, which are acquired via the camera 27, are used. By subjecting these images to image processes, a position of the hand portion 201 relative to the wiring member F is controlled. The suction member 23 is moved to a position at a predetermined distance away above a suction point of the wiring member F. Then, as illustrated in FIG. 10A, the hand portion 201 extends the drive rod R3 by the predetermined distance so as to bring the suction member 23 close to an upper surface of the wiring member F, and vacuum-sucks the wiring member F via the suction port 230.

After the hand portion 201 sucks the wiring member F, as illustrated in FIG. 10B, the hand portion 201 draws back the suction member 23 upward with the drive rod R3. While the hand portion 201 maintains this sucking state, the hand portion 201 clamps the wiring member F in its width direction with the clamping mechanism CL2. With this, the wiring member F is stably held by the hand portion 201.

A position of the wiring member F that the hand portion 201 sucks and holds (suction position) is set to a position spaced by a predetermined distance away from the terminal portion Fa. As described below, this predetermined distance is set to a distance in which the hand portion 101 (clamping mechanism CL1) of the assembly robot 100 can clamp a region between the terminal portion Fa and the suction position.

(Unlocking Step for Connector Component)

Figure 11A:
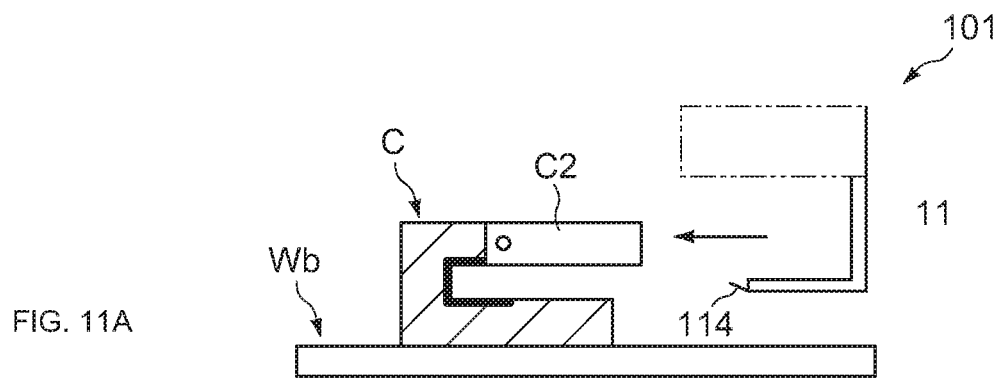
FIGS. 11A, 11B, and 11C Explanatory main-part schematic side views illustrating an unlocking step for the connector component.
Figure 11B:
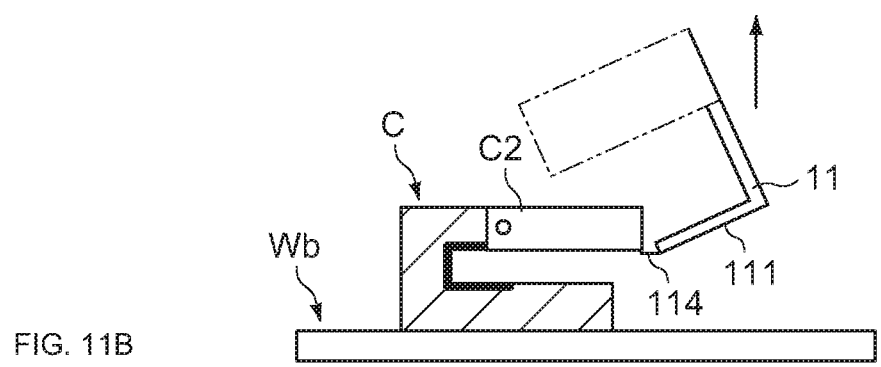
Figure 11C:
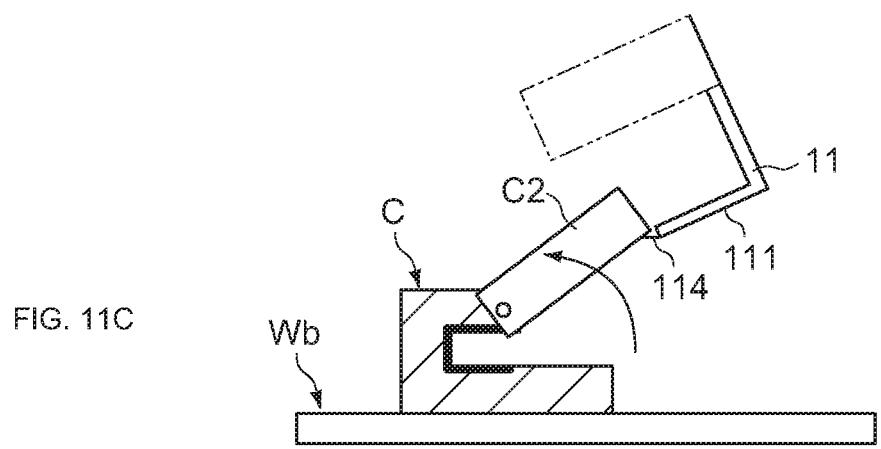

FIGS. 11A, 11B, and 11C are explanatory main-part schematic side views illustrating the unlocking step for the connector component C.

In this step, the assembly robot 100 (hand portion 101) pivots the locking member C2 of the connector component C from the locking position to the half-open position.

In searching for the connector component C on the workpiece W, images depicting the connector component C on the workpiece W, which are acquired via the second camera 172, are used. By subjecting these images to image processes, a position of the hand portion 101 relative to the connector component C is controlled.

As illustrated in FIG. 4 and FIG. 5A, in the hand portion 101, the second clamping claw 12 has been moved upward relative to the first clamping claw 11. As illustrated in FIG. 11A, the hand portion 101 is moved to a position at which the lower end portion of the first clamping claw 11 (support portion 111) is spaced by a predetermined distance away in the Y-axis direction from a distal end of the locking member C2 of the connector component C. As illustrated in FIG. 11B, the hand portion 101 is inclined at a predetermined angle about the y-axis toward the locking member C2 side, and in this state, is advanced toward the locking member C2. Then, the hand portion 101 engages the protruding portion 114 at the distal end of the support portion 111 with a lower side of the distal end of the locking member C2. Next, as illustrated in FIG. 11C, the hand portion 101 is moved upward such that the distal end of the locking member C2 is pushed up by the protruding portion 114. In this way, the locking member C2 is pivoted from the locking position to the half-open position.

Note that, the locking member C2 of the connector component C need not necessarily be at the locking position, and may be at the half-open position or the open position. Also in these cases, by performing the above-described unlocking step, the locking member C2 is allowed to take the half-open position or the open position.

Note that, in certain cases such as a case where the locking member C2 is certainly not at the locking position, this step may be omitted.

(Transfer Step for Connecting Member)

FIGS. 12A and 12B are explanatory main-part schematic side views illustrating the transfer step of transferring the wiring member F from the hand portion 201 of the transport robot 200 to the hand portion 101 of the assembly robot 100.

In this step, the wiring member F is delivered from the transport robot 200 (hand portion 201) to the assembly robot 100 (hand portion 101).

As illustrated in FIG. 12A, the hand portion 201 of the transport robot 200, which holds the wiring member F, waits in a horizontal posture in which the terminal portion Fa of the wiring member F comes to an upper side.

Meanwhile, in the illustrated example, the hand portion 101 of the assembly robot 100 faces the hand portion 201 of the transport robot 200 in a horizontal posture in which the up-and-down member 13 comes to the upper side. As illustrated in FIG. 5A, in the clamping mechanism CL1 of the hand portion 101 at this time, an open position where the second clamping claw 12 is spaced away from the first clamping claw 11 in the z-axis direction is maintained. Positioning of the hand portion 101 relative to the hand portion 201 is performed on the basis of the image signals from the second camera 172.

Next, as illustrated in FIG. 12B, the hand portion 101 of the assembly robot 100 moves relative to the hand portion 201 of the transport robot 200 such that the terminal portion Fa of the wiring member F comes to a position between the support portion 111 of the first clamping claw 11 and the support portion 121 of the second clamping claw 12. Then, the clamping mechanism CL1 is driven to clamp the wiring member F. The wiring member F is clamped at a position, for example, approximately 5 to 10 mm away from the terminal portion Fa, but this clamping position is not particularly limited. Positioning of the hand portion 101 relative to the wiring member F is performed on the basis of the image signals from the first camera 171.

After that, the hand portion 201 of the transport robot 200 discontinues both the suction operation by the suction member 23 and the operation of clamping the wiring member F by the clamping mechanism CL2. With this, the transfer of the wiring member F from the transport robot 200 to the assembly robot 100 is completed.

(Connecting Step with Respect to Connector Component)

FIGS. 13, 14A, 14B, and 14C are explanatory main-part schematic side views illustrating the connecting step for the wiring member F with respect to the connector component C.

In this step, the assembly robot 100 (hand portion 101) pivots the locking member C2 of the connector component C to the open position, and connects the terminal portion Fa of the wiring member F to the connector component C.

Figure 13:
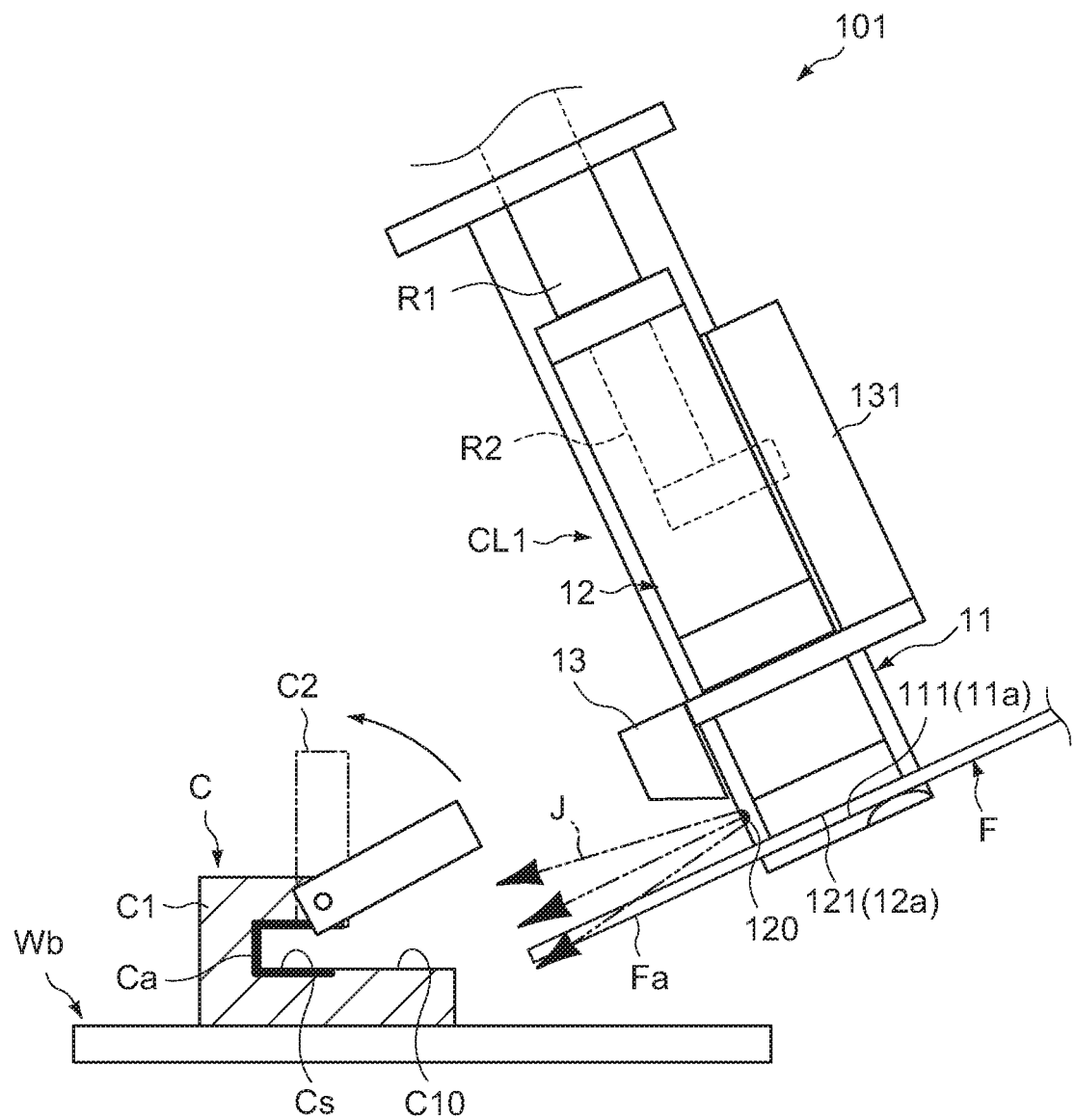
FIG. 13 An explanatory main-part schematic side view illustrating a connecting step for the connecting member with respect to the connector component.

As illustrated in FIG. 13, the hand portion 101 moves the blow-out portion 120 to a position facing the distal end of the locking member C2 of the connector component C, and blows out air jets J through the blow-out portion 120 with the wiring member F being clamped with the support surfaces 11a and 12a. The air jets J blown out through the blow-out portion 120 are impinged on a connecting surface of the connector component C including the locking member C2, and wind pressure thereby causes the locking member C2 to pivot from the half-open position to the open position. With this, the groove portion Cs and the stage portion C10 of the connector component C are widely opened to an outside.

In this embodiment, the blow-out of the air jets through the blow-out portion 120 is not started until a relative distance between the blow-out portion 120 and the locking member C2 is reduced to be equal to or shorter than a predetermined distance. With this, dust generation by ones of the air jets, which are blown out to positions other than the position of the connector component C, can be suppressed.

Further, in this embodiment, the hand portion 101 is controlled to assume a posture inclined about the x-axis at a predetermined angle toward the connector component C such that the air jets J are blown out from obliquely above the connector component C toward the locking member C2. With this, among a set of the air jets J, even ones reflected by surfaces of the stage portion C10 and the circuit board Wb can be utilized. Thus, the locking member C2 can be efficiently pivoted to the open position. Note that, the inclined posture of the hand portion 101 is maintained until the connection of the wiring member F to the connector component C is completed.

Figure 14A:
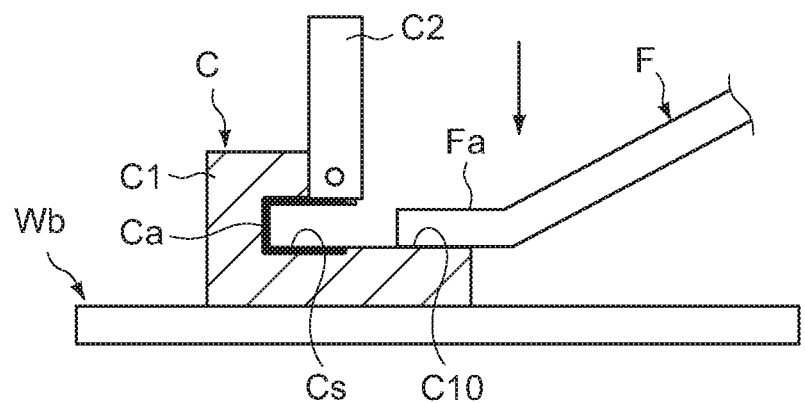
FIGS. 14A, 14B, and 14C Other explanatory main-part schematic side views illustrating the connecting step for the connecting member with respect to the connector component.

Then, as illustrated in FIG. 14A, the hand portion 101 is moved such that the terminal portion Fa of the wiring member F comes directly above the stage portion C10 of the connector component C. From this position, the hand portion 101 presses the terminal portion Fa downward onto the stage portion C10. With this, the terminal portion Fa is horizontally bent in conformity with the upper surface of the stage portion C10. With this, rigidity of the wiring member F is increased, and a straight posture is stably and securely assumed.

Figure 14B:
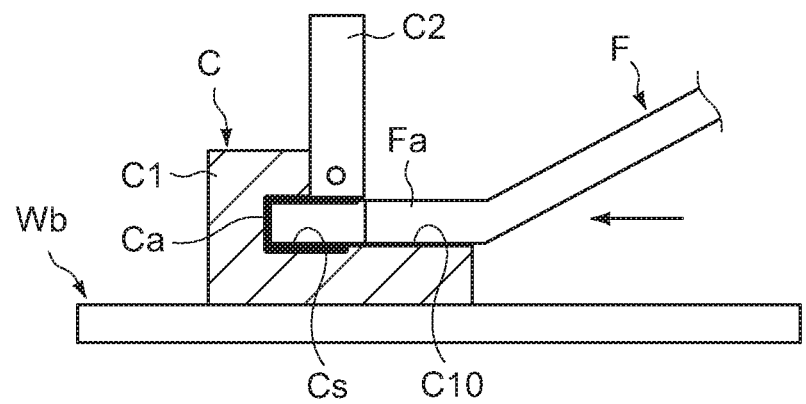

Next, as illustrated in FIG. 14B, the hand portion 101 is advanced toward the connector component C, fits the terminal portion Fa to the groove portion Cs of the connector component C, and then further advances the terminal portion Fa by a predetermined amount. With this, the terminal portion Fa is electrically connected to the terminal portion Ca in the groove portion Cs. Since the wiring member F is increased in rigidity in its width direction as described above, the terminal portion Fa can be stably inserted into the groove portion Cs of the connector component C along with the advance of the hand portion 101.

The blow-out of the air jets J through the blow-out portion 120 is stopped after a lapse of a predetermined time period from the start of the blow-out. In this embodiment, this predetermined time period is set to a time period until the connection of the terminal portion Fa to the connector component C is completed, but this predetermined time period is not particularly limited. With this, a state in which the locking member C2 is always opened can be maintained, and hence the operation of connecting the terminal portion Fa can be reliably performed.

Figure 14C:
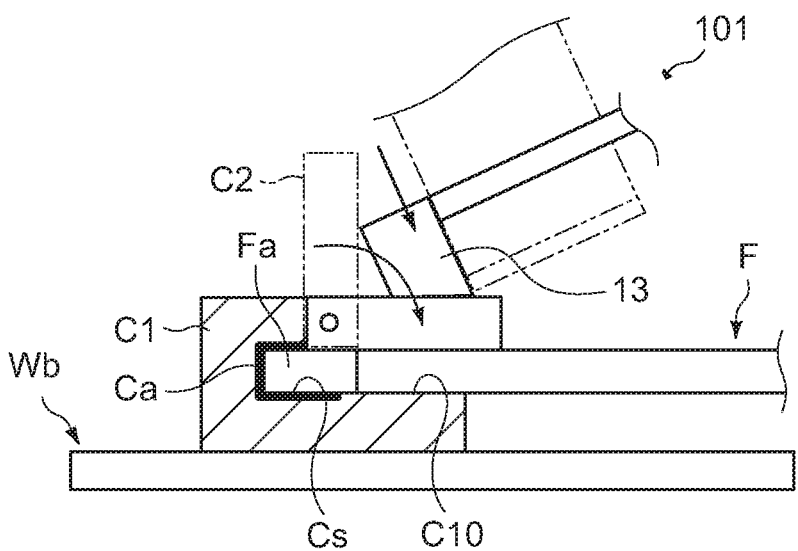

After the terminal portion Fa is connected to the connector component C, the hand portion 101 discontinues the operation of clamping the wiring member F by opening the clamping mechanism CL1. Then, as illustrated in FIG. 14C, while maintaining the inclined posture, the hand portion 101 is moved such that the up-and-down member 13 comes directly above the locking member C2. At this position, the hand portion 101 recloses the clamping mechanism CL1, and moves the up-and-down member 13 downward with the drive rod R2 (refer to FIG. 5C). With this, the locking member C2 is subjected to a downward pressing operation from the up-and-down member 13, and pivots to the locking position.

As described above, according to this embodiment, the hand portion 101 includes the blow-out portion 120. Thus, by the blow-out of the air jets J, the locking member C2 of the connector component C is stably maintained at its open position. With this, the wiring member F can be properly assembled to the connector component C.

Further, according to this embodiment, the blow-out portion 120 is provided to the lateral surface portion 123 of the second clamping claw 12. In this way, the blow-out portion 120 can be built in the second clamping claw 12. With this, the hand portion 101 can be downsized and simplified in configuration.

Still further, according to this embodiment, the first clamping claw 11 of the hand portion 101 includes the coupling portion 113 that is longitudinal in the direction of clamping the wiring member F. Thus, the clamping mechanism CL1 and the articulated arm 102 can be caused to face each other in the direction of clamping the wiring member F. This enables the clamping of the belt-like wiring member F in its width direction to facilitate the transportation of the wiring member F to a height of the connector component C.

Yet further, according to this embodiment, the hand portion 101 includes the force sensor 15. Thus, the external force to be applied to the clamping mechanism CL1, the force at the time of clamping the wiring member F (reactive force) with the clamping mechanism CL1, and the like can be detected. With this, the operation of unlocking the locking position with respect to the locking member C2 of the connector component C, the operation of connecting the wiring member F to the connector component C, the operation of pressing the locking member C2 with the up-and-down member 13 toward the locking position, and the like can be properly controlled.

Yet further, according to this embodiment, the assembly robot 100 and the transport robot 200 are configured to be operated cooperatively with each other to connect the wiring member F to the connector component C. Thus, their respective hand portions 101 and 201 can be avoided being complicated in configuration, and the connecting step for the wiring member F with respect to the connector component C can be stably performed.

<Modifications>

In the above-described embodiment, for example, an industrial robot is exemplified. However, the present technology is applicable also to service robots including those for business purposes. Further, the blow-out portion 120 may be configured to be capable of blowing out not only the air jets but also liquid. Specifically, the present technology is applicable, for example, to an autonomous cleaning device that cleans, while spraying detergent, a floor surface with use of a brush clamped by the clamping mechanism.

Further, the blow-out portion 120, which is provided to the second clamping claw 12 of the hand portion 101 in the above-described embodiment, may be provided to the first clamping claw 11 instead. In addition, not only where to provide the blow-out portion 120 and how many blow-out portions 120 to provide, but also a shape of the blow-out port 120a are not limited to those in the above-described example, and may be changed as appropriate.

Still further, in the case exemplified in the above-described embodiment, the robotic device 1 includes the assembly robot 100 and the transport robot 200. However, the transport robot 200 may be omitted when necessary, and the wiring member F may be connected to the connector component C only by the assembly robot 100.

Yet further, in the example of the above-described embodiment, the present technology is applied to the connection of the wiring member F to the connector component C that includes the locking member C2. However, instead, the present technology may be applicable also to connection to a connector component that does not include the locking member. In this case, the connecting operation can be performed while removing contaminants such as dust and oil in the connecting portion with the air jets to be blown out. In addition, an object can be processed while applying a paint or an adhesive material, or the object can be processed while being washed with the liquid.

Note that, the present technology may also employ the following configurations.

(1) A robotic device, including
a first robot including
a first articulated arm,
a first clamping mechanism including
a first clamping claw
that is attached to the first articulated arm, and
that has a first support surface, and
a second clamping claw
that has a second support surface to face the first support surface in a first axial direction orthogonal to the first support surface, and
that is movable in the first axial direction relative to the first clamping claw, the first clamping mechanism being configured to be capable of clamping an object in the first axial direction with the first support surface and the second support surface, and
a blow-out portion
that is provided to any one of the first clamping claw and the second clamping claw, and
that is configured to be capable of blowing out fluid in a second axial direction orthogonal to the first axial direction.
(2) The robotic device according to (1), in which
the second clamping claw further includes
a lateral surface portion orthogonal to the second axial direction, and
the blow-out portion is provided to the lateral surface portion.
(3) The robotic device according to (1) or (2), in which
the first clamping claw further includes
a base portion that is fixed to the first articulated arm, and
a coupling portion
that is connected between the base portion and the first support surface, and
that extends in the first axial direction.
(4) The robotic device according to any one of (1) to (3), further including
a force sensor
that is arranged between the first articulated arm and the base portion, and
that detects force to be applied to the first clamping mechanism.
(5) The robotic device according to any one of (1) to (4), in which
the first clamping mechanism further includes
an up-and-down member
that is attached to the second clamping claw, and
that is movable in the first axial direction relative to the second clamping claw.
(6) The robotic device according to any one of (1) to (5), in which
the blow-out portion blows out air jets as the fluid.
(7) The robotic device according to any one of (1) to (5), in which
the blow-out portion blows out liquid as the fluid.
(8) The robotic device according to any one of (1) to (7), further including
a second robot including
a second clamping mechanism capable of clamping the object, and
a second articulated arm that supports the second clamping mechanism, the second robot transferring the object from the second clamping mechanism thereof to the first clamping mechanism.
(9) The robotic device according to (8), in which
the second robot further includes
a suction portion that sucks the object portion, and the second clamping mechanism includes
a pair of clamping claws
that face each other in one axial direction orthogonal to a direction in which the suction portion sucks the object, and
that are capable of clamping the object in the one axial direction.
(10) The robotic device according to any one of (1) to (9), in which
the first robot further includes
an imaging unit capable of capturing the object to be clamped by the first clamping mechanism.
(11) A production device for an electronic apparatus, the electronic apparatus including
a connector including
an openable-and-closable locking member, and
a connecting member including
a connecting terminal to be connected to the connector, the production device including:
an articulated arm;
a clamping mechanism including
a first clamping claw
that is attached to the articulated arm, and
that has a first support surface, and
a second clamping claw
that has a second support surface to face the first support surface in a first axial direction orthogonal to the first support surface, and
that is movable in the first axial direction relative to the first clamping claw, the clamping mechanism being configured to be capable of clamping the connecting member in the first axial direction with the connecting terminal being protruded in a second axial direction orthogonal to the first axial direction from the first support surface and the second support surface; and
a blow-out portion
that is provided to any one of the first clamping claw and the second clamping claw, and
that is configured to be capable of blowing out fluid with respect to the locking member that faces the blow-out portion in the second axial direction.
(12) A production method for an electronic apparatus, the electronic apparatus including
a connector including
an openable-and-closable locking member, and
a connecting member including
a connecting terminal to be connected to the connector, the production method including:
causing a clamping mechanism to clamp the connecting member in a thickness direction of the connecting member;
transporting the clamping mechanism to a position at which the connecting terminal faces the connector;
opening the locking member by blowing out fluid from the clamping mechanism to the connector; and
connecting the connecting terminal to the connector by causing the clamping mechanism to bring the connecting member close to the connector.

(13) The production method for the electronic apparatus according to (12), in which
the connecting member is
an FPC (Flexible Printed Circuit) or
an FFC (Flexible Flat Cable).
(14) The production method for the electronic apparatus according to (12) or (13), in which
the fluid includes air jets.

REFERENCE SIGNS LIST 1 robotic device
11 first clamping claw
11a support surface
12 second clamping claw
12a support surface
13 up-and-down member
14 protruding portion
15 force sensor
23 suction member
171, 172 camera
100 assembly robot
120 blow-out portion
101 hand portion
102 articulated arm
111 support portion
112 base portion
113 coupling portion
200 transport robot
201 hand portion
202 articulated arm
C connector component
C2 locking member
CL1 first clamping mechanism
CL2 second clamping mechanism
F wiring member
Fa terminal portion

The invention claimed is:

1. A robotic device for assembly of an electronic apparatus, the robotic device comprising:
a first robot including:
a first articulated arm; and
a first clamping mechanism including:
a first clamping claw attached to the first articulated arm, wherein the first clamping claw has a first support surface;
a second clamping claw that has a second support surface, wherein
the second support surface faces the first support surface in an axial direction orthogonal to the first support surface,
the second clamping claw is movable in the axial direction relative to the first clamping claw,
the first clamping mechanism is configured to clamp an object in the axial direction with the first support surface and the second support surface, and
the first articulated arm is configured to move the object towards a connector of the electronic apparatus;
a blow-out portion on one of the first clamping claw or the second clamping claw, wherein
the blow-out portion is configured to blow out fluid in a direction towards the connector of the electronic apparatus such that the blown out fluid is impinged on a locking member of the connector, and
the direction is orthogonal to the axial direction; and
an up-and-down member attached to the second clamping claw, wherein
the up-and-down member includes an elastic material, and
the up-and-down member is movable in the axial direction relative to the second clamping claw to cause the locking member of the connector to pivot from a first position to a second position different from the first position.

2. The robotic device according to claim 1, wherein
the second clamping claw further includes a lateral surface portion orthogonal to the direction, and
the blow-out portion is on the lateral surface portion.

3. The robotic device according to claim 1, wherein
the first clamping claw further includes:
a base portion fixed to the first articulated arm; and
a coupling portion connected between the base portion and the first support surface, wherein the coupling portion extends in the axial direction.

4. The robotic device according to claim 3, further comprising a force sensor between the first articulated arm and the base portion, wherein the force sensor is configured to detect a force applied to the first clamping mechanism.

5. The robotic device according to claim 1, wherein the fluid comprises air jets.

6. The robotic device according to claim 1, wherein the fluid comprises liquid.

7. The robotic device according to claim 1, further comprising
a second robot that includes:
a second clamping mechanism configured to clamp the object; and
a second articulated arm configured to support the second clamping mechanism, wherein the second robot is configured to transfer the object from the second clamping mechanism to the first clamping mechanism.

8. The robotic device according to claim 7, wherein
the second robot further includes a suction portion configured to suck the object,
the second clamping mechanism includes a pair of clamping claws,
the pair of clamping claws comprises a first clamping claw and a second clamping claw that faces the first clamping claw of the pair of clamping claws in the axial direction orthogonal to a direction in which the suction portion sucks the object, and
the second clamping mechanism is further configured to clamp the object in the axial direction.

9. The robotic device according to claim 1, wherein
the first robot further includes an imaging unit, and
the imaging unit is configured to capture the object to be clamped by the first clamping mechanism.

10. A production device for assembly of an electronic apparatus, the production device comprising:
an articulated arm; and
a clamping mechanism including:
a first clamping claw attached to the articulated arm, wherein the first clamping claw has a first support surface; and
a second clamping claw that has a second support surface, wherein
the second support surface faces the first support surface in an axial direction orthogonal to the first support surface, the second clamping claw is movable in the axial direction relative to the first clamping claw, the clamping mechanism is configured to clamp a connecting member of the electronic apparatus in the axial direction with a connecting terminal of the connecting member protruded in a direction orthogonal to the axial direction from the first support surface and the second support surface, and the articulated arm is configured to move the connecting member towards a connector of the electronic apparatus;

a blow-out portion on one of the first clamping claw or the second clamping claw, wherein the blow-out portion is configured to blow out fluid towards an openable-and-closable locking member of the connector such that the blown out fluid is impinged on the openable-and-closable locking member of the connector, and the openable-and-closable locking member faces towards the blow-out portion in the direction; and an up-and-down member attached to the second clamping claw, wherein the up-and-down member includes an elastic material, and the up-and-down member is movable in the axial direction relative to the second clamping claw to cause the openable-and-closable locking member of the connector to pivot from a first position to a second position different from the first position.

11. The robotic device according to claim 1, wherein the elastic material includes one of rubber or elastomeric resin.

12. The robotic device according to claim 1, further comprising a movable block coupled to the up-and-down member, wherein the movable block is configured to move in the axial direction relative to the second clamping claw, and the up-and-down member is different from the movable block.

13. The robotic device according to claim 1, wherein the blow-out portion is configured to blow out the fluid towards the locking member for a determined time-period until the object is connected to the connector.

* * * * *